United States Patent
Meyer et al.

(10) Patent No.: US 11,393,742 B2
(45) Date of Patent: Jul. 19, 2022

(54) METHOD FOR FABRICATING A SEMICONDUCTOR FLIP-CHIP PACKAGE

(71) Applicant: Infineon Technologies AG, Neubiberg (DE)

(72) Inventors: Thorsten Meyer, Regensburg (DE); Irmgard Escher-Poeppel, Duggendorf (DE); Klaus Pressel, Regensburg (DE); Bernd Rakow, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 9 days.

(21) Appl. No.: 16/892,735

(22) Filed: Jun. 4, 2020

(65) Prior Publication Data

US 2020/0388561 A1 Dec. 10, 2020

(30) Foreign Application Priority Data

Jun. 6, 2019 (DE) .......................... 102019115369.7

(51) Int. Cl.
| | |
|---|---|
| *H01L 21/56* | (2006.01) |
| *H01L 23/495* | (2006.01) |
| *H01L 23/31* | (2006.01) |
| *H01L 23/00* | (2006.01) |
| *H01L 21/48* | (2006.01) |

(52) U.S. Cl.
CPC .... *H01L 23/49513* (2013.01); *H01L 21/4825* (2013.01); *H01L 21/561* (2013.01); *H01L 23/3107* (2013.01); *H01L 23/4952* (2013.01); *H01L 24/08* (2013.01); *H01L 24/81* (2013.01); *H01L 2224/08258* (2013.01); *H01L 2224/8183* (2013.01); *H01L 2224/81205* (2013.01)

(58) Field of Classification Search
CPC ........... H01L 23/49513; H01L 23/3107; H01L 23/4952; H01L 21/4825; H01L 21/561; H01L 24/08; H01L 24/81
See application file for complete search history.

(56) References Cited

U.S. PATENT DOCUMENTS

| | | | |
|---|---|---|---|
| 5,477,087 A | 12/1995 | Kawakita et al. | |
| 2009/0108443 A1* | 4/2009 | Jiang | ........................ H01L 24/12 257/737 |
| 2013/0062757 A1 | 3/2013 | Feger et al. | |
| 2013/0075890 A1* | 3/2013 | Gallegos | ............. H01L 21/4853 257/735 |
| 2015/0221601 A1 | 8/2015 | Kim et al. | |

(Continued)

FOREIGN PATENT DOCUMENTS

| | | |
|---|---|---|
| DE | 10258081 A1 | 7/2004 |
| DE | 10223738 B4 | 9/2007 |
| JP | S63307768 A | 12/1988 |

*Primary Examiner* — Nathan W Ha
(74) *Attorney, Agent, or Firm* — Murphy, Bilak & Homiller, PLLC

(57) ABSTRACT

A semiconductor flip-chip package includes a substrate having a first main face, a second main face opposite to the first main face, and one or more conductive structures disposed on the first main face, one or more pillars disposed on at least one of the conductive structures, a semiconductor die having one or more contact pads on a main face thereof, the semiconductor die being connected to the substrate so that at least one of the contact pads is connected with one of the pillars, and an encapsulant disposed on the substrate and the semiconductor die.

19 Claims, 6 Drawing Sheets

(56) References Cited

U.S. PATENT DOCUMENTS

| | | | |
|---|---|---|---|
| 2016/0276174 A1* | 9/2016 | Kim | H01L 21/4857 |
| 2016/0351482 A1 | 12/2016 | Zhang et al. | |
| 2017/0081175 A1* | 3/2017 | Steiert | B81C 1/00301 |
| 2017/0317036 A1* | 11/2017 | Myers | H01L 23/562 |
| 2017/0323868 A1* | 11/2017 | Park | H01L 25/105 |
| 2017/0345714 A1* | 11/2017 | Scharf | H01L 24/06 |
| 2018/0025965 A1 | 1/2018 | Canete, Jr. et al. | |
| 2018/0060479 A1 | 3/2018 | Lo et al. | |
| 2018/0190622 A1* | 7/2018 | Lin | H01L 23/13 |
| 2019/0006269 A1* | 1/2019 | Xu | H01L 21/4882 |
| 2019/0164906 A1* | 5/2019 | Yanagida | H01L 23/3107 |
| 2019/0348303 A1* | 11/2019 | Kulkarni | H01L 24/81 |
| 2020/0020620 A1* | 1/2020 | Gurrum | H01L 21/563 |
| 2020/0211961 A1* | 7/2020 | Khanolkar | H01F 17/0006 |
| 2020/0258822 A1* | 8/2020 | Lopez | H01L 23/3135 |
| 2020/0258842 A1* | 8/2020 | Ng | H01L 23/5384 |
| 2020/0291538 A1* | 9/2020 | Pielmeier | H01L 24/27 |
| 2020/0357987 A1* | 11/2020 | Li | G01R 15/202 |
| 2020/0365505 A1* | 11/2020 | Zhang | H01L 21/485 |

* cited by examiner

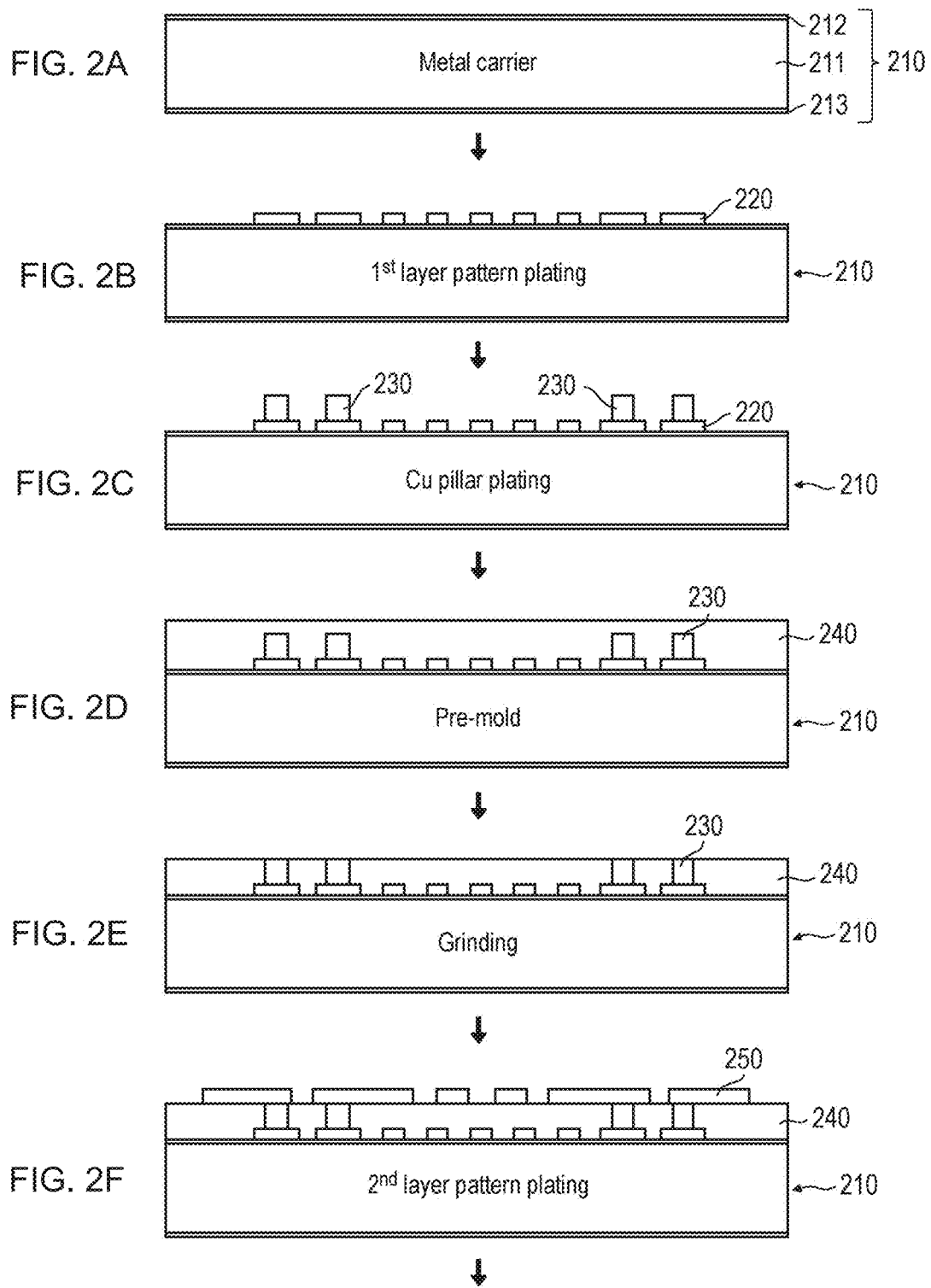

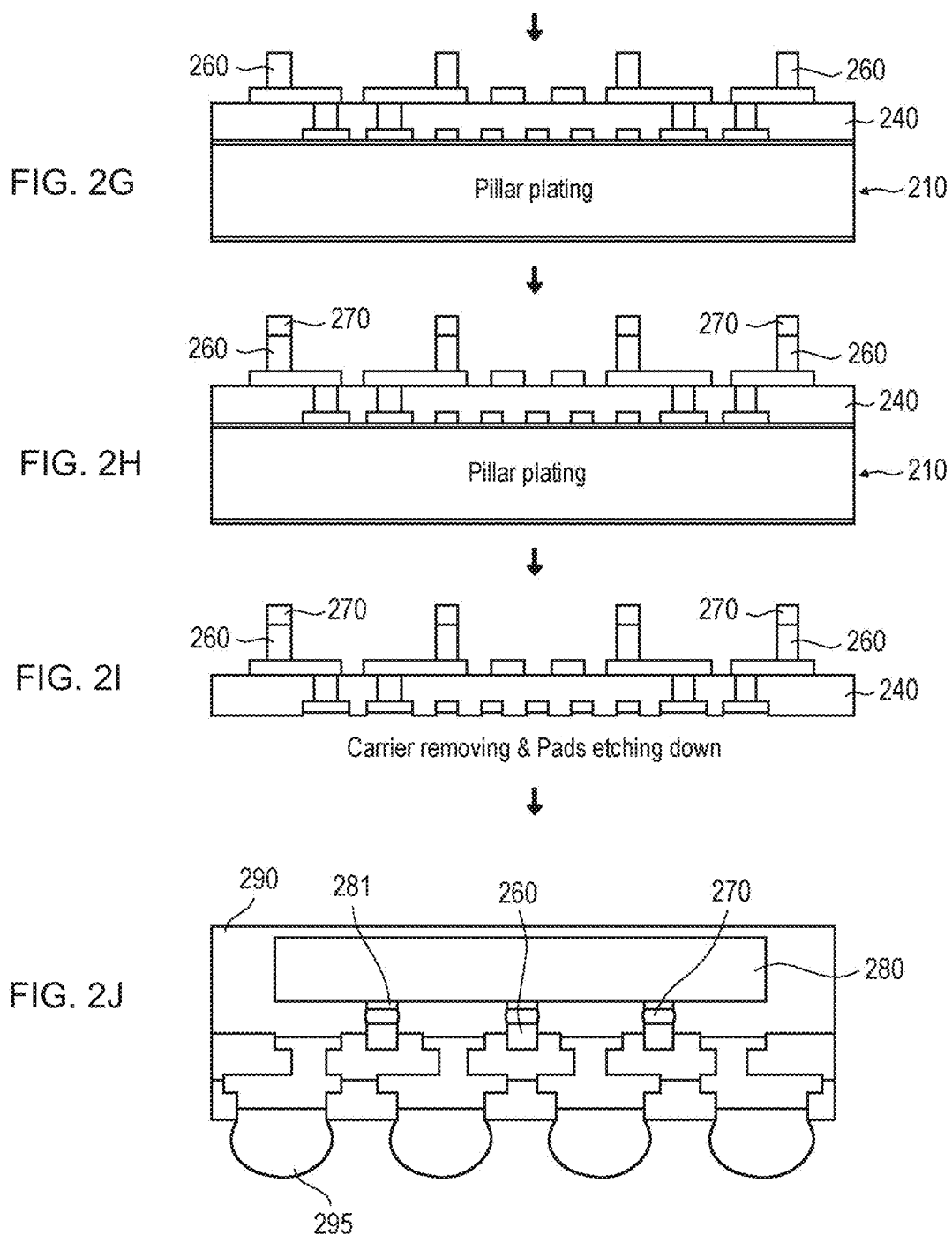

METHOD FOR FABRICATING A SEMICONDUCTOR FLIP-CHIP PACKAGE

TECHNICAL FIELD

The present disclosure is related to a method for fabricating a semiconductor flip-chip package and to a semiconductor flip-chip package. In particular, the present disclosure is related to fabricating a semiconductor flip-chip package in which the substrate is either an interconnect substrate or a leadframe.

BACKGROUND

The requirement of good electrical performance with low parasitic inductances and capacitances and short interconnects in semiconductor packages has led to the addition of flip chip packages to many package platform roadmaps. Flip-chip mounting is a method for connecting semiconductor dies to a substrate, e.g. a circuit board or another die, with solder bumps that have been deposited onto the die pads. The solder bumps are deposited on the die pads on the top surface of the semiconductor die. In order to mount the die to the substrate the die is flipped over so that its top surface faces down, and aligned so that its pads align with matching pads on the substrate. Finally the solder bumps are reflowed to complete the interconnect. These flip chip technologies are known to provide excellent electrical performance and also small form factor, no matter on which kind of substrate flip-chip bumped dies are fixed.

SUMMARY

A first aspect of the present disclosure is related to a method for fabricating a semiconductor flip-chip package, the method comprising providing an interconnect substrate, in particular a molded interconnect substrate (MIS), comprising a first main face, a second main face opposite to the first main face, and one or more conductive structures disposed on the first main face, forming one or more pillars over at least one of the conductive structures, providing a semiconductor die comprising one or more contact pads on a main face thereof, attaching the semiconductor die to the substrate so that at least one of the contact pads is connected with one of the pillars, and applying an encapsulant to the substrate and the semiconductor die.

A second aspect of the present disclosure is related to a method for fabricating a semiconductor flip-chip package, the method comprising providing a leadframe comprising a die pad and/or one or more leads, forming one or more pillars over at least one or more of the die pad or one or more of the leads, providing a semiconductor die comprising one or more contact pads on a main face thereof, attaching the semiconductor die to the die pad or one or more of the leads so that at least one of the contact pads is connected with one of the pillars, and applying an encapsulant to the die pad, the leads and the semiconductor die.

A third aspect of the present disclosure is related to a semiconductor flip-chip package comprising a substrate comprising a first main face, a second main face opposite to the first main face, and one or more conductive structures disposed on the first main face, one or more pillars disposed on at least one of the conductive structures, a semiconductor die comprising one or more contact pads on a main face thereof, wherein the semiconductor die is connected to the substrate so that at least one of the contact pads is connected with one of the pillars, and an encapsulant disposed on the substrate and the semiconductor die.

A fourth aspect of the present disclosure is related to a semiconductor flip-chip package comprising a leadframe comprising a die pad and/or one or more leads, one or more pillars disposed on the die pad and/or on one or more of the leads, a semiconductor die comprising one or more contact pads on a main face thereof, wherein the semiconductor die is connected to the die pad or to one or more of the leads so that at least one of the contact pads is connected with one of the pillars, and an encapsulant disposed on the die pad, the leads, and the semiconductor die.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

FIGS. 2A to 2J show schematic cross-sectional side view representations of intermediate products (FIG. 2A to 2I) and a finished semiconductor flip-chip package (FIG. 2J) for illustrating an example of a method for fabricating a semiconductor flip-chip package according to the first aspect.

DETAILED DESCRIPTION

Figure 1:
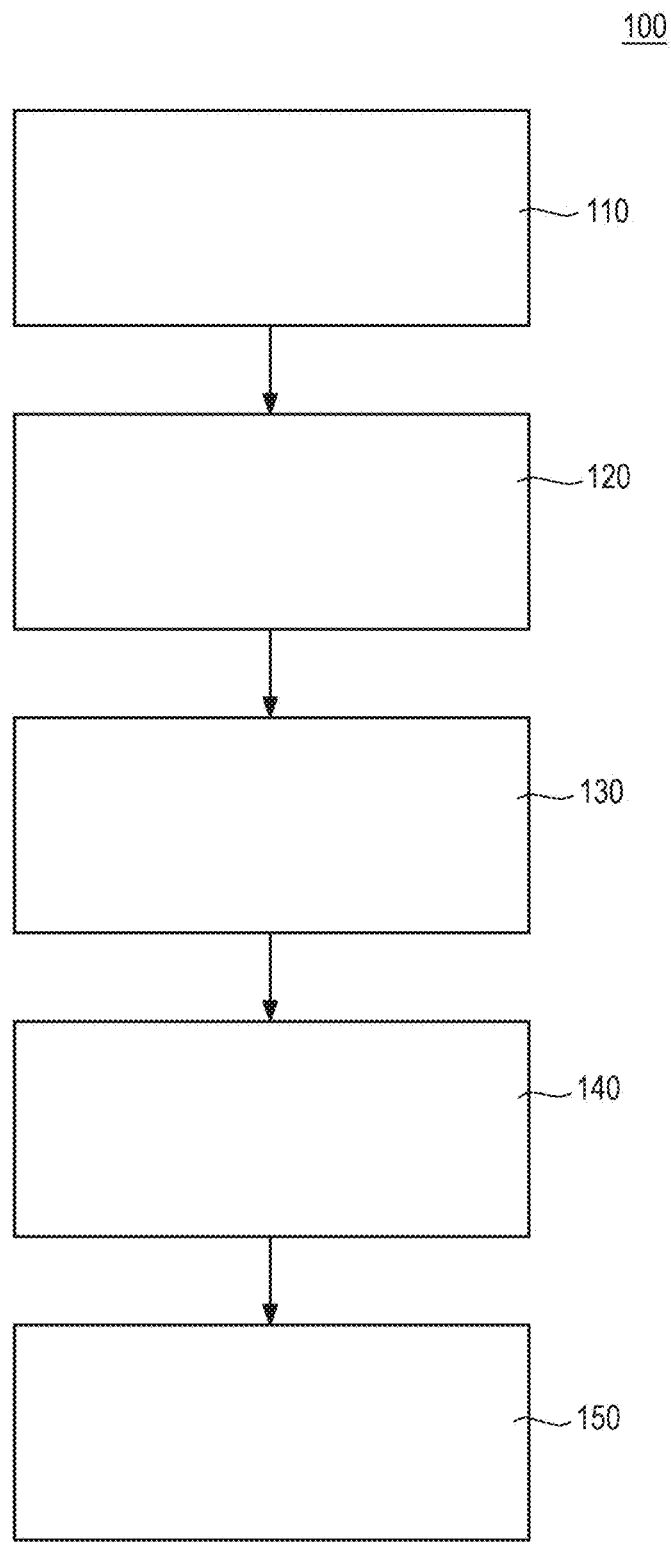
FIG. 1 shows a flowchart of an example of a method for fabricating a semiconductor flip-chip package according to the first aspect, which method comprises utilizing an MIS substrate as the substrate for the semiconductor flip-chip package.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Semiconductor flip-chip packages containing semiconductor dies are described below. The semiconductor dies may be of different types, may be manufactured by different technologies and may include for example integrated electrical, electro-optical or electro-mechanical circuits and/or passives. The semiconductor dies may, for example, be designed as logic integrated circuits, analog integrated circuits, mixed signal integrated circuits, power integrated circuits, memory circuits or integrated passives. They may include control circuits, microprocessors or microelectromechanical components.

The method and the semiconductor flip-chip package comprise the fabrication of pillars. The pillars can be fabricated by an entirely conductive material like e.g. Cu or an Cu alloy, wherein the conductive material may comprise a solder layer on top. The pillars may also be fabricated by a conductive material like e.g. Cu or a Cu alloy, wherein the material may comprise a silicone post on top which comprises a conductive layer or spiral deposited onto a surface of the silicone post.

The semiconductor flip-chip package includes an encapsulant. The encapsulant may be a dielectric material and may be made of any appropriate duroplastic, thermoplastic or thermosetting material, wherein any of the afore-mentioned materials may be made by molding or printing, or a laminate (prepreg) which may be made by laminating. The encapsulant may contain filler materials. After its deposition, the encapsulant may be only partially hardened and may be completely hardened after application of energy (e.g. heat, UV light, etc.) to form an encapsulant. Various techniques may be employed to apply the encapsulant, for example transfer molding, compression molding, injection molding, powder molding, liquid molding, dispensing, laminating, or printing, dispensing or jetting a glob top material.

FIG. 1 shows a flow diagram for illustrating an example of the method of the first aspect. The method 100 of FIG. 1 comprises providing a molded interconnect substrate (MIS) comprising a first main face, a second main face opposite to the first main face, and one or more conductive structures disposed on the first main face (110), forming one or more pillars over at least one of the conductive structures (120), providing a semiconductor die comprising one or more contact pads on a main face thereof (130), attaching the semiconductor die to the substrate so that at least one of the contact pads is connected with one of the pillars (140), and applying an encapsulant to the substrate and the semiconductor die (150).

According to an example of the method of FIG. 1, the pillars are formed by one or more of galvanic plating, etching, coining, or stamping.

According to an example of the method of FIG. 1, the pillars comprise or are made of a main body made of Cu, Al, or alloys thereof. The conductive pillars may in addition comprise a solder cap.

According to an example of the method of FIG. 1, a height of the pillars is in a range of from 20 μm to 120 μm, more specifically from 40 μm to 100 μm, more specifically from 40 μm to 80 μm, more specifically from 40 μm to 60 μm.

According to an example of the method of FIG. 1, a width of the pillars is in a range of from 40 μm to 120 μm, from 80 μm to 120 μm, or from 40 μm to 80 μm, more specifically from 50 μm to 70 μm.

According to an example of the method of FIG. 1, the pillars comprise a circular or a rectangular cross-section.

According to an example of the method of FIG. 1, the method further comprises applying a solder material layer on top of the pillars, and connecting the contact pads of the semiconductor die by a solder process to the pillars. According to a further example thereof, the solder material layer comprises a Sn layer or a SnAg layer, in particular together with an intermediate Ni layer. A height of the solder material layer can be in a range from 10 μm to 40 μm, more specifically from 15 μm to 40 μm, more specifically from 20 μm to 40 μm, more specifically from 25 μm to 35 μm. According to a further example, the solder material layer can be deposited by one or more of electro-plating, electro-less plating, printing, dispensing, solder-wiring, jetting, or placing.

According to an example of the method of FIG. 1, the contact pads and the pillars comprise copper or are made of copper or a copper alloy and the method further comprises connecting the contact pads of the semiconductor die to the pillars by Cu—Cu diffusion bonding. According to a further example thereof, either one or both of the surfaces of the contact pads and the pillars comprise one or more of copper nano-grass, copper nanowires, or porous copper.

According to an example of the method of FIG. 1, connecting at least one of the contact pads with one of the pillars comprises ultrasonic bonding.

According to an example of the method of FIG. 1, forming the one or more pillars is performed additively by placing a mask above the substrate, the mask comprising mask openings defining the positions of the pillars to be formed, and then depositing the material of the pillars into the mask openings.

According to an example of the method of FIG. 1, forming the one or more conductive pillars is performed subtractively by depositing the material of the pillars to be formed in form of a continuous layer, and then removing portions of the layer so that only the pillars remain.

According to an example of the method of FIG. 1, the method further comprises fabricating a plurality of semiconductor flip-chip packages by providing a panel which comprises a large MIS substrate, providing a plurality of semiconductor dies, attaching the semiconductor dies to the panel, applying an encapsulant to the panel and the semiconductor dies, and singulating the panel into a plurality of semiconductor flip-chip packages. According to a further example thereof the size of the panel is in a range from 100×100 mm2 to 1000×1000 mm2, more specifically from 200×200 mm2 to 900×900 mm2, more specifically from 300×300 mm2 to 800×800 mm2, more specifically from 400×400 mm2 to 800×800 mm2, more specifically from 500×500 mm2 to 700×700 mm2.

According to an example of the method of FIG. 1, the method further comprises providing a carrier substrate onto which the MIS substrate is built up, and further comprising removing the carrier substrate after depositing the copper pillars, or after depositing the solder bumps, or after connecting the semiconductor die to the copper pillars.

FIGS. 2A to 2J illustrate an example of a method for fabricating a semiconductor flip-chip package according to the first aspect.

FIG. 2A shows the providing of a carrier substrate 210 comprising an intermediate electrically insulating layer 211, a first upper metallic layer 212, and a second lower metallic layer 213. The carrier substrate 210 serves as an auxiliary carrier and will be removed later. It is also possible to use another type of carrier which comprises an upper metallic layer.

FIG. 2B shows the depositing of a pattern of a first layer 220. The first layer 220 can be made of copper and can be deposited by galvanic plating wherein the first metallic layer 212 of the carrier substrate 210 serves as a seed layer. The patterning can be performed, e.g. subtractively, namely by depositing a continuous copper layer and afterwards etching away the unwanted copper regions.

FIG. 2C shows the depositing of first copper pillars 230 by galvanic plating. The first copper pillars 230 serve as vias to the next routing layers.

FIG. 2D shows the overmolding of the structure by applying a first encapsulant 240 by e.g. transfer molding.

FIG. 2E shows the grinding of the first encapsulant 240 from above until the upper surfaces of the first copper pillars 230 are exposed to the outside.

FIG. 2F shows the depositing of a pattern of a second layer 250. The second layer 250 can also be made of copper and can be deposited by galvanic plating. The patterning can be performed e.g. by an additive process by a seed layer which is electro-plated or electro-less plated or, e.g. subtractively, namely by depositing a continuous copper layer and afterwards etching away the unwanted copper regions.

FIG. 2G shows the depositing of second copper pillars 260 by galvanic plating. The second copper pillars 260 serve as connectors to the pads of a semiconductor die.

FIG. 2H shows the depositing of solder bumps or balls 270 onto the upper surfaces of the second copper pillars 260. The solder layers 280 serve to connect the second copper pillars 260 to the chip pads by a solder process.

FIG. 2I shows the removal of the carrier substrate 210 and the etching back of the first layer 220 from below.

FIG. 2J shows the providing of a semiconductor die comprising contact pads 281 disposed on one of its main surfaces, flipping the semiconductor die 280 over so that its contact pads 281 face downwards, and align the semiconductor die 280 so that its contact pads 281 align with particular second conductive pillars 260 on the intermediate product. Finally the solder bumps 270 are reflowed to be transformed into stable solder connections. The solder connections are located closer to the semiconductor die 280 than for regular flip-chip packages. In other words, a distance between the solder connections and the surface of the semiconductor die 280 is less than a distance between the solder connections and a surface of the second layer 250.

FIG. 2J further shows the overmolding of the structure by applying of a second encapsulant 290 so that the second encapsulant 290 is disposed onto an upper surface of the first encapsulant 240 and complete embeds the semiconductor 280. Finally solder balls 295 are connected with the exposed pads of the first layer 220.

Figure 3:
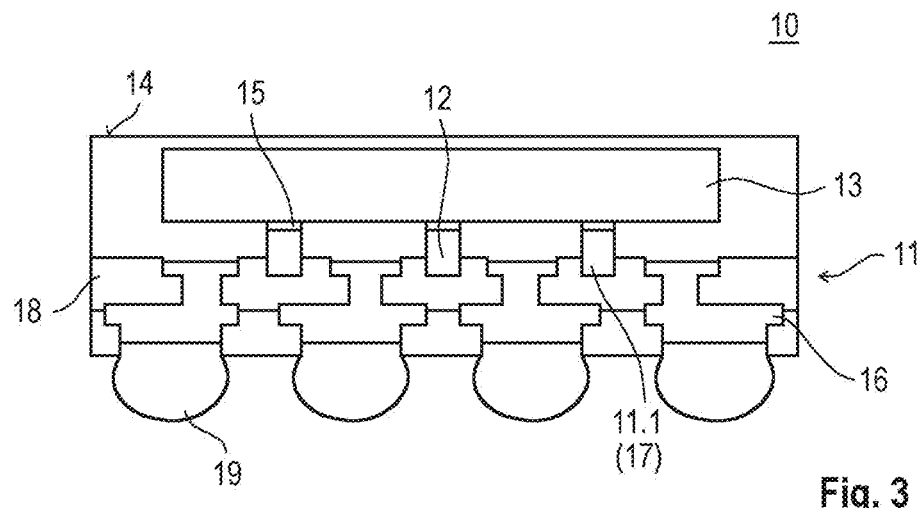
FIG. 3 shows a schematic cross-sectional side view representation of a semiconductor flip-chip package comprising a substrate comprising conductive structures and conductive pillars disposed on the conductive structures, and a semiconductor die comprising contact pads, wherein the semiconductor die is connected with its contact pads to the conductive pillars.

FIG. 3 shows a schematic cross-sectional representation of a semiconductor flip-chip package according to the third aspect. The semiconductor flip-chip package 10 of FIG. 3 comprises a substrate 11 comprising a first main face, a second main face opposite to the first main face, and one or more conductive structures 11.1 disposed on the first main face, one or more conductive pillars 12 disposed on at least one of the conductive structures 11.1, a semiconductor die 13 comprising one or more contact pads 13.1 on a main face thereof, wherein the semiconductor die 13 is connected to the substrate 11 so that at least one of the contact pads 13.1 is connected with one of the conductive pillars 12, and an encapsulant 14 disposed on the substrate 11 and the semiconductor die 13.

According to an example of the semiconductor flip-chip package 10 of FIG. 3, the semiconductor flip-chip package 10 further comprises joining or connecting layers 15, each one of the joining layers 15 being disposed between one of the conductive pillars 12 and one of the contact pads 13.1. The joining layers 15 serve for a stable connection between the conductive pillars 12 and the contact pads 13.1. According to further example thereof, a distance between a joining layer 15 and a surface of the semiconductor die 13 is less than a distance between the joining layer 15 and a surface of the substrate 11.

According to a further example of the semiconductor flip-chip package 10 of FIG. 3, each one of the joining layers 15 may comprise a solder connection layer, i.e. a layer which results from a soldering process. In particular, the solder connection layer may comprise Sn or SnAg, and possibly in addition an intermediate Ni layer.

According to a further example of the semiconductor flip-chip package 10 of FIG. 3, each one of the joining layers 15 may comprise a layer resulting from Cu—Cu diffusion bonding process. According to a further example thereof, in the Cu—Cu diffusion bonding process either one or both of the surfaces of the contact pads and the conductive pillars comprise one or more of copper nano-grass, copper nanowires, or porous copper.

According to a further example of the semiconductor flip-chip package 10 of FIG. 3, each one of the joining layers 15 may comprise a layer resulting from an ultrasonic bonding process.

According to a further example of the semiconductor flip-chip package 10 of FIG. 3, the substrate 11 is a molded interconnect substrate (MIS) and further comprises a first patterned metallic layer 16, a second patterned metallic layer 17, a further encapsulant 18, and solder balls 19 attached to exposed portions of the first patterned metallic layer 16, wherein the conductive structures 11.1 are portions of the second patterned metallic layer 17.

Further examples of the semiconductor flip-chip package of the third aspect can be formed in accordance with examples which were described above in connection with a method according to the first aspect.

Figure 4:
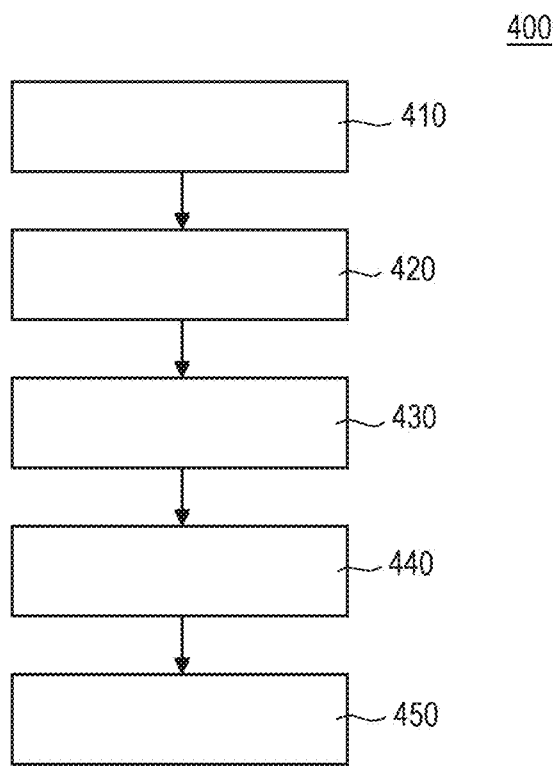
FIG. 4 shows a flowchart of an example of a method for fabricating a semiconductor flip-chip package according to the second aspect, which method comprises utilizing a leadframe as the substrate for the semiconductor flip-chip package.

FIG. 4 shows a flow diagram for illustrating an example of the method of the second aspect. The method 400 of FIG. 4 comprises a method for fabricating a semiconductor flip-chip package, the method comprising providing a leadframe comprising a die pad and one or more leads (410), forming one or more conductive pillars over the die pad (420), providing a semiconductor die comprising one or more contact pads on a main face thereof (430), attaching the semiconductor die to the die pad so that at least one of the contact pads is connected with one of the conductive pillars (440), and applying an encapsulant to the die pad, the leads, and the semiconductor die (450).

According to an example of the method of FIG. 4, the conductive pillars are formed by galvanic plating.

According to an example of the method of FIG. 4, the conductive pillars comprise or are made of Cu, Al, or alloys thereof.

According to an example of the method of FIG. 4, a height of the pillars is in a range of from 20 µm to 120 µm, more specifically from 40 µm to 100 µm, more specifically from 40 µm to 80 µm, more specifically from 40 µm to 60 µm.

According to an example of the method of FIG. 4, a width of the pillars is in a range of from 40 µm to 120 µm, or from 80 µm to 120 µm, or from 40 µm to 80 µm, more specifically from 50 µm to 70 µm.

According to an example of the method of FIG. 4, the pillars comprise a circular or a rectangular cross-section.

According to an example of the method of FIG. 4, the method further comprises applying a solder material on top of the conductive pillars, and connecting the contact pads of the semiconductor die by a solder process to the conductive pillars. According to a further example thereof, the solder material comprises a Sn layer or a SnAg layer, in particular together with an intermediate Ni layer.

According to an example of the method of FIG. 4, the contact pads and the conductive pillars comprise copper or are made of copper or a copper alloy and the method further comprises connecting the contact pads of the semiconductor die to the conductive pillars by Cu—Cu diffusion bonding. According to a further example thereof, either one or both of the surfaces of the contact pads and the conductive pillars comprise one or more of copper nano-grass, copper nanowires, or porous copper.

According to an example of the method of FIG. 4, connecting at least one of the contact pads with one of the conductive pillars comprises ultrasonic bonding.

According to an example of the method of FIG. 4, forming the one or more conductive pillars is performed additively by placing a mask above the substrate, the mask comprising mask openings defining the positions of the pillars to be formed, and then depositing the material of the pillars into the mask openings.

According to an example of the method of FIG. 4, forming the one or more conductive pillars is performed subtractively by providing, in particular depositing the material of the pillars to be formed in form of a continuous layer, and then removing portions of the layer so that only the pillars remain.

According to an example of the method of FIG. 4, the method further comprises fabricating a plurality of semiconductor flip-chip packages by providing a panel which comprises a plurality of leadframes, providing a plurality of semiconductor dies, attaching the semiconductor dies to the panel, applying an encapsulant to the panel and the semiconductor dies, and singulating the panel into a plurality of semiconductor flip-chip packages. According to a further example thereof the size of the panel is in a range from 100×100 mm2 to 1000×1000 mm2, more specifically from 200×200 mm2 to 900×900 mm2, more specifically from 300×300 mm2 to 800×800 mm2, more specifically from 400×400 mm2 to 800×800 mm2, more specifically from 500×500 mm2 to 700×700 mm2.

According to an example of the method of FIG. 4, a width of the pillars is greater than a width of the leads.

According to an example of the method of FIG. 4, forming the one or more conductive pillars is performed by coining or precision stamping, wherein the leadframe is subjected to a sufficiently high stress to induce plastic flow on the surface of the material.

Further examples of the method of the second aspect can be formed in accordance with examples or features which were described above in connection with a method according to the first aspect.

FIGS. 5A to 5E illustrate an example of a method for fabricating a semiconductor flip-chip package according to the second aspect.

Figure 5A:
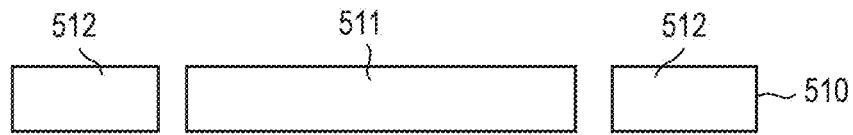
FIGS. 5A to 5E show schematic cross-sectional side view representations of intermediate products (FIG. 5A to 5D) and a finished semiconductor flip-chip package (FIG. 5E) for illustrating an example of a method for fabricating a semiconductor flip-chip package according to the second aspect.

FIG. 5A shows the providing of a leadframe 510 comprising a die pad 511 and one or more leads 512.

Figure 5B:
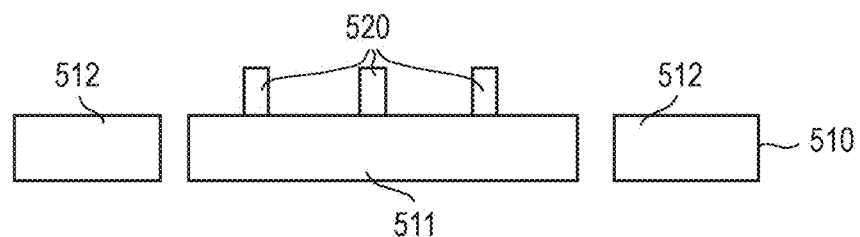

FIG. 5B shows the forming of the conductive pillars 520 over the die pad 511 by, e.g. galvanic plating.

Figure 5C:
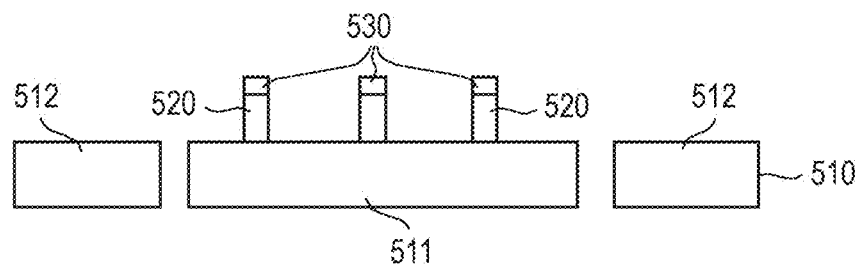

FIG. 5C shows the forming of solder bumps 530 on an upper surface of the conductive pillars 520.

Figure 5D:
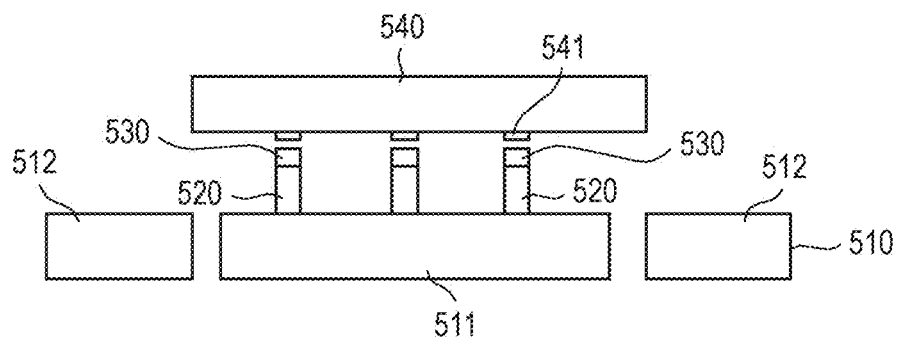

FIG. 5D shows the providing of a semiconductor die 540 comprising one or more contact pads 541, and attaching the semiconductor die 540 to the die pad 511 so that each one of the contact pads 541 is connected with one of the conductive pillars 520.

Figure 5E:
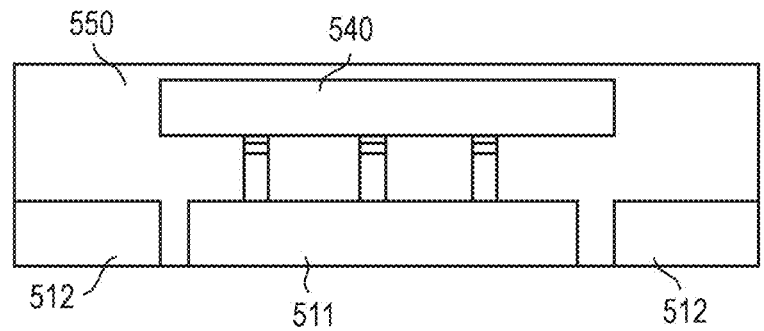

FIG. 5E shows the applying of an encapsulant 550 to the die pad 511, the leads 512, and the semiconductor die 540.

Figure 6:
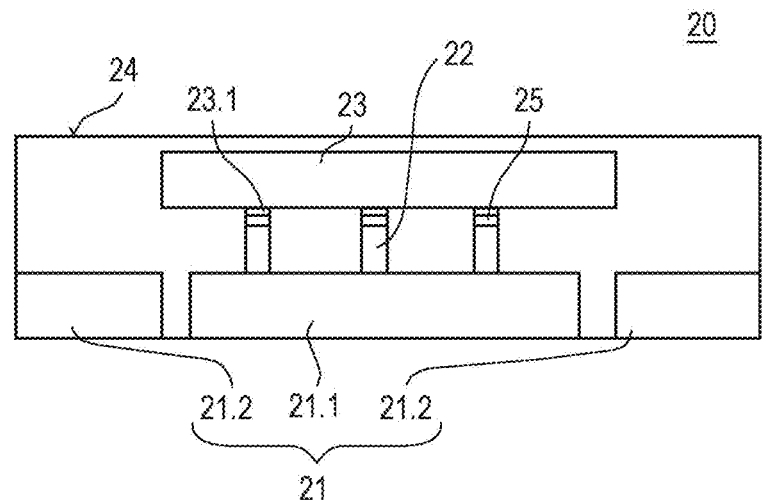
FIG. 6 shows a schematic cross-sectional side view representation of a semiconductor flip-chip package comprising a leadframe comprising leads and conductive pillars disposed on the leads, and a semiconductor die comprising contact pads, wherein the semiconductor die is connected with its contact pads to the conductive pillars.

FIG. 6 shows a schematic cross-sectional representation of a semiconductor flip-chip package according to the fourth aspect. The semiconductor flip-chip package 20 of FIG. 6 comprises a leadframe 21 comprising a die pad 21.1 and one or more leads 21.2, one or more conductive pillars 22 disposed on the die pad 21.1, a semiconductor die 23 comprising one or more contact pads 23.1 on a main face thereof, wherein the semiconductor die 23 is connected to the leadframe 21 so that at least one of the contact pads 23.1 is connected with one of the conductive pillars 22, and an encapsulant 24 disposed on the leadframe 21 and the semiconductor die 23.

According to an example of the semiconductor flip-chip package 20 of FIG. 6, the semiconductor flip-chip package 20 further comprises joining or connecting layers 25, each one of the joining layers 25 being disposed between one of the conductive pillars 22 and one of the contact pads 23.1. The joining layers 25 serve for a stable connection between the conductive pillars 22 and the contact pads 23.1. According to a further example thereof, a distance between a joining layer 25 and a surface of the semiconductor die 23 is less than a distance between the joining layer 25 and a surface of the die pad 21.1.

According to a further example of the semiconductor flip-chip package 20 of FIG. 6, each one of the joining layers 25 may comprise a solder connection layer, i.e. a layer which results from a soldering process. In particular, the solder connection layer may comprise Sn or SnAg, and possibly in addition an intermediate Ni layer.

According to a further example of the semiconductor flip-chip package 20 of FIG. 6, each one of the joining layers 25 may comprise a layer resulting from a Cu—Cu diffusion bonding process. According to a further example thereof, in the Cu—Cu diffusion bonding process either one or both of the surfaces of the contact pads and the conductive pillars comprise one or more of copper nano-grass, copper nanowires, or porous copper.

According to a further example of the semiconductor flip-chip package 20 of FIG. 6, each one of the joining layers 25 may comprise a layer resulting from an ultrasonic bonding process.

According to a further example of the semiconductor flip-chip package 20 of FIG. 6, the semiconductor flip-chip package may be configured as a VQFN (Very Thin Quad Flat No Leads) package.

Further examples of the semiconductor flip-chip package of the fourth aspect can be formed in accordance with examples or features which were described above in connection with a method according to the second aspect.

Figure 7:
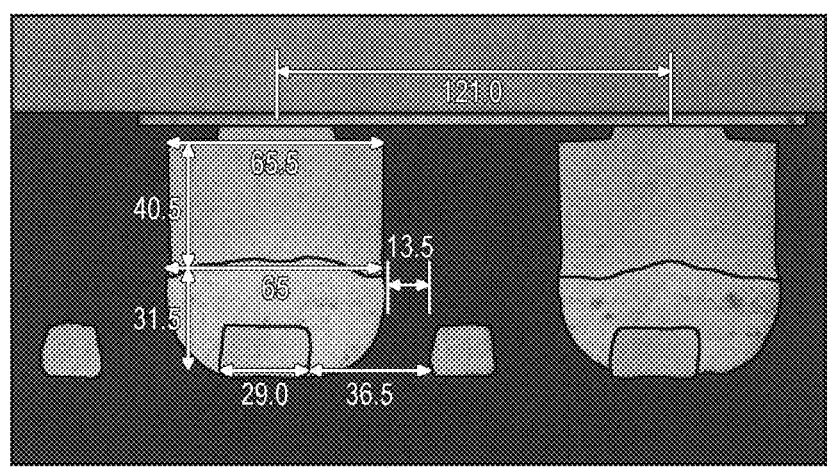
FIG. 7 shows a schematic cross-sectional side view representation of two adjacent Cu pillars disposed on a lead of a leadframe, together with drawn-in spatial dimensions of the conductive pillars.

FIG. 7 shows a schematic cross-sectional side view representation of two adjacent pillars disposed on a lead of a leadframe, together with drawn-in spatial dimensions of the conductive pillars (in μm). The left-sided pillar comprises a Cu pillar having a height of 40.5 μm, a width of 65.5 μm. A solder layer applied on top of the Cu pillar comprises a height of 31.5 μm and a width of 65 μm. A distance of the pillar from an adjacent wire is 13.5 μm. A width of a horizontal plateau on top of the solder layer is 29.0 μm and distance of the plateau to the wire is 36.5 μm. A center-to-center distance between the two pillars is 121.0 μm.

Figure 8:
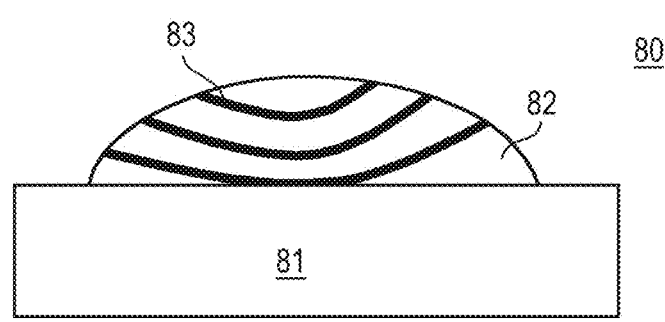
FIG. 8 shows a schematic cross-sectional side view representation of an example of a conductive pillar comprising a silicone post having on top of it a copper spiral plated thereon.

FIG. 8 shows a schematic cross-sectional side view representation of a further example of a pillar. The pillar 80 of FIG. 8 comprises a basic post 81, a silicone post 82 deposited onto an upper surface of the basic post 81, and a metallic spiral 83, e.g. fabricated of copper, deposited onto the surface of the silicone post 82. The silicone post 82 may comprise an elastic condition and may further comprise the form of a hemisphere and the spiral 83 may be deposited in such a way that it makes contact to the basic post 81 and is at least partly exposed on an upper surface of the silicone post 82 so that it can make contact to any conductive material brought into contact with the upper surface of the silicone post 81. The basic post 81 can be a pillar such as was described in one of the previous examples and can e.g. be fabricated of Cu or a Cu alloy. One advantage of the silicone post 81 is that the basic post 81 does not need to have a height like the pillars described in the previous examples. The metallic spiral 83 may act like a spring which may compensate for tolerances. It can be fabricated e.g. by electro-plating or electroless plating.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

Example 1 is a method for fabricating a semiconductor flip-chip package, the method comprising providing an interconnect substrate comprising a first main face, a second main face opposite to the first main face, and one or more conductive structures disposed on the first main face, forming one or more pillars over at least one of the conductive structures, providing a semiconductor die comprising one or more contact pads on a main face thereof, attaching the semiconductor die to the substrate so that at least one of the contact pads is connected with one of the pillars, and applying an encapsulant to the substrate and the semiconductor die.

Example 2 is a method for fabricating a semiconductor flip-chip package, the method comprising providing a leadframe comprising a die pad and/or one or more leads, forming one or more pillars over the die pad and/or over one or more of the leads, providing a semiconductor die comprising one or more contact pads on a main face thereof, attaching the semiconductor die to the die pad so that at least one of the contact pads is connected with one of the pillars, and applying an encapsulant to the die pad, the leads and the semiconductor die.

Example 3 is a method according to Example 1 or 2, wherein the pillars are formed by galvanic plating.

Example 4 is a method according to any one of the preceding Examples, wherein the pillars are made of Cu, Al, alloys thereof or a Cu/Zn alloy, and may comprise on an upper surface a solder layer comprising one or more of Sn, SnAg, Ag, NiAu, or Pd.

Example 5 is a method according to any one of the preceding Examples, wherein the pillars comprise a basic post, a silicone post deposited onto an upper surface of the basic post, and a metallic layer, in particular a metallic spiral, in particular a copper spiral, deposited onto the surface of the silicone post.

Example 6 is a method according to any one of the preceding Examples, wherein a height of the pillars is in a range of from 20 μm to 120 μm, more specifically from 40 μm to 100 μm, more specifically from 40 μm to 80 μm, more specifically from 40 μm to 60 μm.

Example 7 is a method according to any one of the preceding Examples, wherein a width of the pillars is in a range of from 40 μm to 120 μm, or from 80 μm to 120 μm, or from 40 μm to 80 μm, more specifically from 50 μm to 70 μm.

Example 8 is a method according to Example 2, wherein a width of the pillars is greater than a width of the leads.

Example 9 is a method according to any one of the preceding Examples, further comprising applying a solder material on top of the conductive pillars, and connecting the contact pads of the semiconductor die by a solder process to the conductive pillars.

Example 10 is a method according to any one of the Examples 1 to 8, further comprising connecting the contact pads of the semiconductor die to the pillars by Cu—Cu diffusion bonding or ultrasonic bonding.

Example 11 is a method according to any one of the preceding Examples, wherein forming the one or more conductive pillars is performed additively by placing a mask above the substrate or the leads, the mask comprising mask openings defining the positions of the pillars to be formed, and then depositing the material of the pillars into the mask openings.

Example 12 is a method according to any one of the preceding Examples, wherein forming the one or more conductive pillars is performed subtractively by depositing the material of the pillars to be formed in form of a continuous layer, and then removing portions of the layer so that only the pillars remain.

Example 13 is a method according to any one of the preceding Examples, further comprising fabricating a plurality of semiconductor flip-chip packages by providing a panel which comprises a plurality of substrates or leadframes; providing a plurality of semiconductor dies, attaching the semiconductor dies to the panel, applying an encapsulant to the panel and the semiconductor dies; and singulating the panel into a plurality of semiconductor flip-chip packages.

Example 14 is a method according to Example 13, wherein the size of the panel is in a range from 100×100 mm2 to 1000×1000 mm2.

Example 15 is a semiconductor flip-chip package, comprising a substrate comprising a first main face, a second main face opposite to the first main face, and one or more conductive structures disposed on the first main face, one or more pillars disposed on at least one of the conductive structures, a semiconductor die comprising one or more contact pads on a main face thereof, wherein the semiconductor die is connected to the substrate so that at least one of the contact pads is connected with one of the pillars, and an encapsulant disposed on the substrate and the semiconductor die.

Example 16 is a semiconductor flip-chip package, comprising a leadframe comprising a die pad and/or one or more leads, one or more pillars disposed on the die pad and/or on one or more of the leads, a semiconductor die comprising one or more contact pads on a main face thereof, wherein the semiconductor die is connected to the leadframe so that at least one of the contact pads is connected with one of the pillars, and an encapsulant disposed on the leadframe and the semiconductor die.

Example 17 is a semiconductor flip-chip package according to the Examples 15 or 16, further comprising a joining layer disposed between the pillar and the contact pad wherein a distance between the joining layer and the semiconductor die is smaller than a distance between the joining layer and the conductive structure on the first main face of the substrate or the die pad or the leads.

Example 18 is a semiconductor flip-chip package according to Example claim 17, wherein the joining layer is a solder layer.

Example 19 is a semiconductor flip-chip package according to any one of Examples 15 to 18, wherein a height of the pillars is in a range of from 20 µm to 120, more specifically from 40 µm to 100 µm, more specifically from 40 µm to 80 µm, 40 µm to 60 µm.

Example 20 is a semiconductor flip-chip package according to any one of Examples 15 to 19, wherein a width of the pillars is in a range of from 40 µm to 120 µm, from 80 µm to 120 µm, or from 40 µm to 80 µm, more specifically from 50 µm to 70 µm.

Example 21 is a semiconductor flip-chip package according to any one of Examples 15 to 20, wherein the pillars are made of Cu, Al, or alloys thereof and possibly comprise on top a silicone post comprising a metallic layer on an upper surface thereof.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a semiconductor flip-chip package, the method comprising:
   providing a leadframe comprising a die pad and/or one or more leads;
   providing a semiconductor die comprising one or more contact pads on a main face of the semiconductor die;
   forming one or more pillars on the leadframe, the one or more pillars having a proximal end attached to the die pad and/or one or more of the leads and a distal end that is freestanding prior to attachment of the semiconductor die to the leadframe;
   after forming the one or more pillars on the leadframe, attaching the semiconductor die to the die pad, including connecting at least one of the contact pads to the distal end of at least one of the one or more pillars; and
   applying an encapsulant to the die pad, the one or more leads and the semiconductor die.

2. The method of claim 1, wherein the one or more pillars are formed by galvanic plating of the leadframe.

3. The method of claim 1, wherein the one or more pillars are made of Cu, Al, alloys of Cu and Al, or a Cu/Zn alloy.

4. The method of claim 1, further comprising a solder layer comprising one or more of Sn, SnAg, Ag, NiAu, and Pd on an upper surface of the one or more pillars.

5. The method of claim 1, wherein the one or more pillars comprise a basic post, a silicone post deposited onto an upper surface of the basic post, and a metallic layer.

6. The method of claim 5, wherein the metallic layer is a copper spiral deposited onto a surface of the silicone post.

7. The method of claim 1, wherein a height of the one or more pillars is in a range of from 20 µm to 120 µm.

8. The method of claim 1, wherein a width of the pillars is in a range of from 40 μm to 120 μm, from 80 μm to 120 μm, or from 40 μm to 80 μm.

9. The method of claim 1, wherein a width of the one or more pillars is greater than a width of the one or more leads.

10. The method of claim 1, further comprising:
applying a solder material on top of the one or more pillars; and
connecting the one or more contact pads of the semiconductor die by a solder process to the one or more pillars.

11. The method of claim 1, further comprising:
connecting the one or more contact pads of the semiconductor die to the one or more pillars by Cu—Cu diffusion bonding or ultrasonic bonding.

12. The method of claim 1, wherein forming the one or more pillars comprises:
additively placing a mask above the leadframe or the one or more leads, the mask comprising one or more mask openings defining each position of the one or more pillars to be formed; and
after placing the mask, depositing a material of the one or more pillars into the one or more mask openings.

13. The method of claim 1, wherein forming the one or more pillars comprises:
subtractively depositing a material of the one or more pillars to be formed as a continuous layer; and
removing one or more portions of the continuous layer so that only the one or more pillars remain.

14. The method of claim 1, further comprising:
fabricating a plurality of semiconductor flip-chip packages by providing a panel which comprises a plurality of substrates or leadframes;
providing a plurality of semiconductor dies;
attaching the semiconductor dies to the panel;
applying an encapsulant to the panel and the semiconductor dies; and
singulating the panel into a plurality of semiconductor flip-chip packages.

15. The method of claim 14, wherein a size of the panel is in a range from 100×100 mm2 to 1000×1000 mm2.

16. A semiconductor flip-chip package, comprising:
a leadframe comprising a die pad and/or one or more leads;
one or more pillars disposed on the die pad and/or on one or more of the one or more leads;
a semiconductor die comprising one or more contact pads on a main face of the semiconductor die, wherein the semiconductor die is connected to the leadframe so that at least one of the one or more contact pads is connected with one of the one or more pillars; and
an encapsulant disposed on the leadframe and the semiconductor die,
wherein the one or more pillars are made of Cu, Al, or alloys of Cu and Al,
wherein the one or more pillars comprise a silicone post comprising a metallic layer on an upper surface of the one or more pillars.

17. The semiconductor flip-chip package of claim 16, further comprising:
a joining layer disposed between the one or more pillars and the one or more contact pads,
wherein a distance between the joining layer and the semiconductor die is smaller than a distance between the joining layer and the die pad or the one or more leads.

18. The semiconductor flip-chip package of claim 17, wherein the joining layer is a solder layer.

19. The semiconductor flip-chip package of claim 16, wherein a height of the one or more pillars is in a range of from 20 μm to 120.

* * * * *